(12) United States Patent  
Wang et al.

(10) Patent No.: US 7,826,208 B2  
(45) Date of Patent: Nov. 2, 2010

(54) CASE STRUCTURE FOR COMPUTER DEVICE

(75) Inventors: Jia-Bin Wang, Shanghai (CN); Shou-Jen Yang, Taipei (TW)

(73) Assignee: Inventec Corporation, Taipei (TW)

( * ) Notice: Subject to any disclaimer, the term of this patent is extended or adjusted under 35 U.S.C. 154(b) by 110 days.

(21) Appl. No.: 12/398,765

(22) Filed: Mar. 5, 2009

(65) Prior Publication Data

US 2010/0226083 A1  Sep. 9, 2010

(51) Int. Cl.
*G06F 1/16* (2006.01)

(52) U.S. Cl. .............................. 361/679.26; 312/223.2; 174/666; 248/220.31; 385/139

(58) Field of Classification Search .............. 312/223.2, 312/408, 333, 221, 334.14; 174/72 C, 144, 174/666; 248/311.2, 188.5, 243, 220.31, 248/371; 385/135, 139, 148, 81, 18; 361/679.01, 361/679.02, 679.32, 679.36, 679.41, 679.43, 361/679.44, 679.57, 679.26; 52/506.7

See application file for complete search history.

(56) References Cited

U.S. PATENT DOCUMENTS

| 5,966,887 | A  | * | 10/1999 | Mieyal ..................... 52/506.07 |
| 7,193,855 | B2 | * | 3/2007 | Fan et al. .................... 361/724 |
| 2008/0136298 | A1 | * | 6/2008 | Xiao ....................... 312/223.2 |

* cited by examiner

*Primary Examiner*—Hung V Duong  
(74) *Attorney, Agent, or Firm*—Tim Tingkang Xia; Morris, Manning & Martin, LLP (57) ABSTRACT

A case structure for a computer device is disposed in a cabinet. The case structure includes a case and a stop member. The case has a first slot on a sidewall of the case. The stop member includes a fixing section, a cantilever section, and a stop section. The fixing section is fixed on a side surface of the case. The cantilever section is formed by extending from the fixing section and may be deformed. The stop section is formed by extending from the cantilever section. At least one blocking piece is disposed on a side surface of the stop section. The blocking piece normally passes through the first slot and protrudes on an outer side surface of the case, so that the blocking piece is held against the cabinet. When the cantilever section is deformed, the blocking piece is merged into the first slot.

10 Claims, 15 Drawing Sheets

CASE STRUCTURE FOR COMPUTER DEVICE

BACKGROUND OF THE INVENTION

1. Field of Invention

The present invention relates to a case structure, and more particularly, to a case structure having a stop member for a computer device.

2. Related Art

With the rapid development of technology, computer equipments such as desktop computers, notebook computers, or server computers have become very popular electronic devices. Especially for many corporations currently, an electronic operation manner is adopted to access related data files, and thus a computer mainframe with powerful functions is required for related operations and data access. For corporations and related industrial companies, server computers are very important and indispensable computer equipments.

As a single computer device is incapable of satisfying the demand of corporations and organs with a huge amount of data, currently a plurality of server computers is usually electrically interconnected to form a large-scale computer station. For ease of electrical connections between the server computers and in order to separate operation mainframes in different working ranges, the server computers are usually loaded in a cabinet to facilitate administration and maintenance operations of relates personnel. Currently, a plurality of accommodating spaces is separated by slide rail regions inside a conventional cabinet, such that the server computers are placed in the accommodating spaces, respectively.

However, a slide rail is designed in the conventional cabinet for the rapid installation or detachment of the server computer, and no related limiting mechanism is designed for limiting a sliding position of the server computer within the cabinet. Thus, when a technician needs to maintain or check the server computer, the server computer must be first drawn out of the cabinet, and kept at a static balance position, so that damages caused by the fall-off of the server computer from the cabinet may be avoided. If an operator draws out the server computer for too long a distance, the balance of the server computer might possibly be broken due to its own weight or collision during the maintenance, and as a result the server computer overturns in the cabinet. Therefore, the operator has to draw out the server computer very carefully, and also work with great caution during the maintenance, or draw out the whole set of the server computer from the cabinet, and then move the server computer to a working platform for related maintenance and checking. These operation means to avoid the overturn of the server computer from the cabinet may cause inconveniences to the operators, and consume too much processing time. Moreover, the risk that the server computer is easy to overturn from the cabinet is not completely eliminated.

To solve the above problems, manufacturers have proposed various stopping mechanisms for fixing or limiting a removable data access device. However, the stopping mechanism of a conventional removable device is improved for the removable device itself and a structure of the cabinet slide rail. Thereby, the stopping mechanism is rather complicated in structure design, its occupied space and manufacturing cost are relatively increased, and it is also inconvenient in practical applications.

Thus, it becomes one of the problems in urgent need of solutions to provide a simple mechanism capable of preventing overturn of the server computer when drawn out of the cabinet by a certain distance for maintenance.

SUMMARY OF THE INVENTION

Accordingly, the present invention is a case structure for a computer device. A case of the computer device is limited within a cabinet by a blocking piece of a stop section disposed on the case, thereby eliminating the possibility of overturn of the computer device when drawn out of the cabinet by too long a distance.

In order to realize the above objective, the present invention discloses a case structure for a computer device in an embodiment. The case structure is disposed in a cabinet. The case structure comprises a case and a stop member. The case has a first slot on at least one sidewall. The stop member is disposed on a sidewall of the case. The stop member further comprises a fixing section, a cantilever section, and a stop section. The fixing section is fixed on a side surface of the sidewall of the case. The cantilever section is formed by extending from the fixing section. The cantilever section may be deformed and displaced relative to the fixing section. The stop section is formed by extending from the cantilever section. At least one blocking piece is disposed protrusively on a side surface of the stop section. The blocking piece normally passes through the first slot and is disposed protrusively on an outer side surface of the sidewall of the case, such that the blocking piece is held against the cabinet. When the cantilever section is deformed or displaced, the blocking piece is merged into the first slot.

By means of the stop member disposed on the case of the computer device and capable of being moveably displaced, when the case is drawn out of the cabinet for a distance, the stop member is held against the cabinet and the case is limited within the cabinet. Therefore, an overturn of the computer device from the cabinet due to the fact that the case is drawn out for too long a distance is prevented, and resulted damages to the computer device are also avoided. Moreover, the operator is able to maintain the computer device without completely drawing out the case of the device from the cabinet, so that the operation time is reduced and the maintenance process is simplified.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
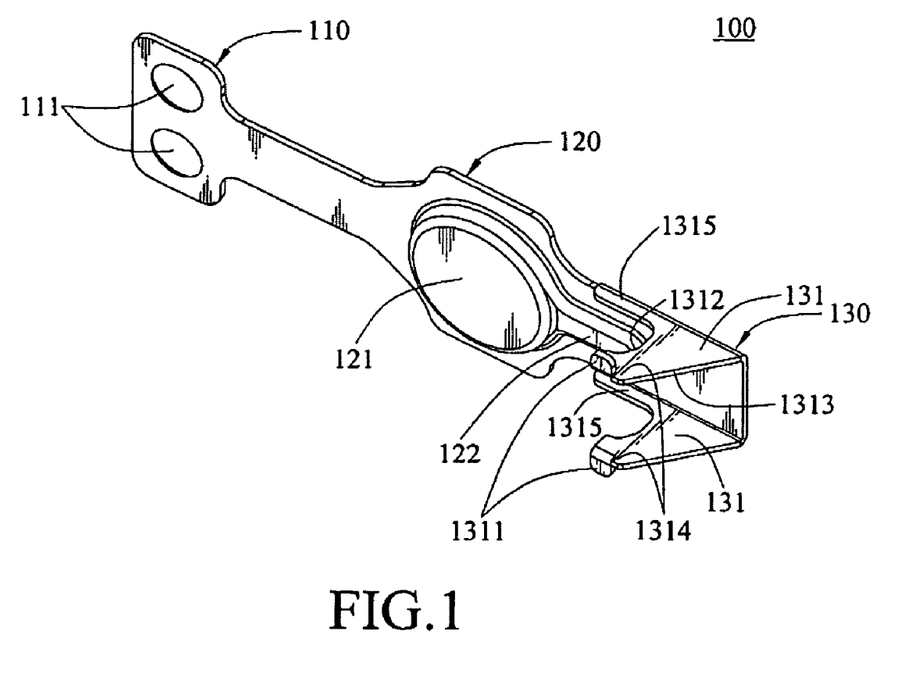
FIG. 1 is a schematic view of a stop member according to the present invention.
Figure 2:
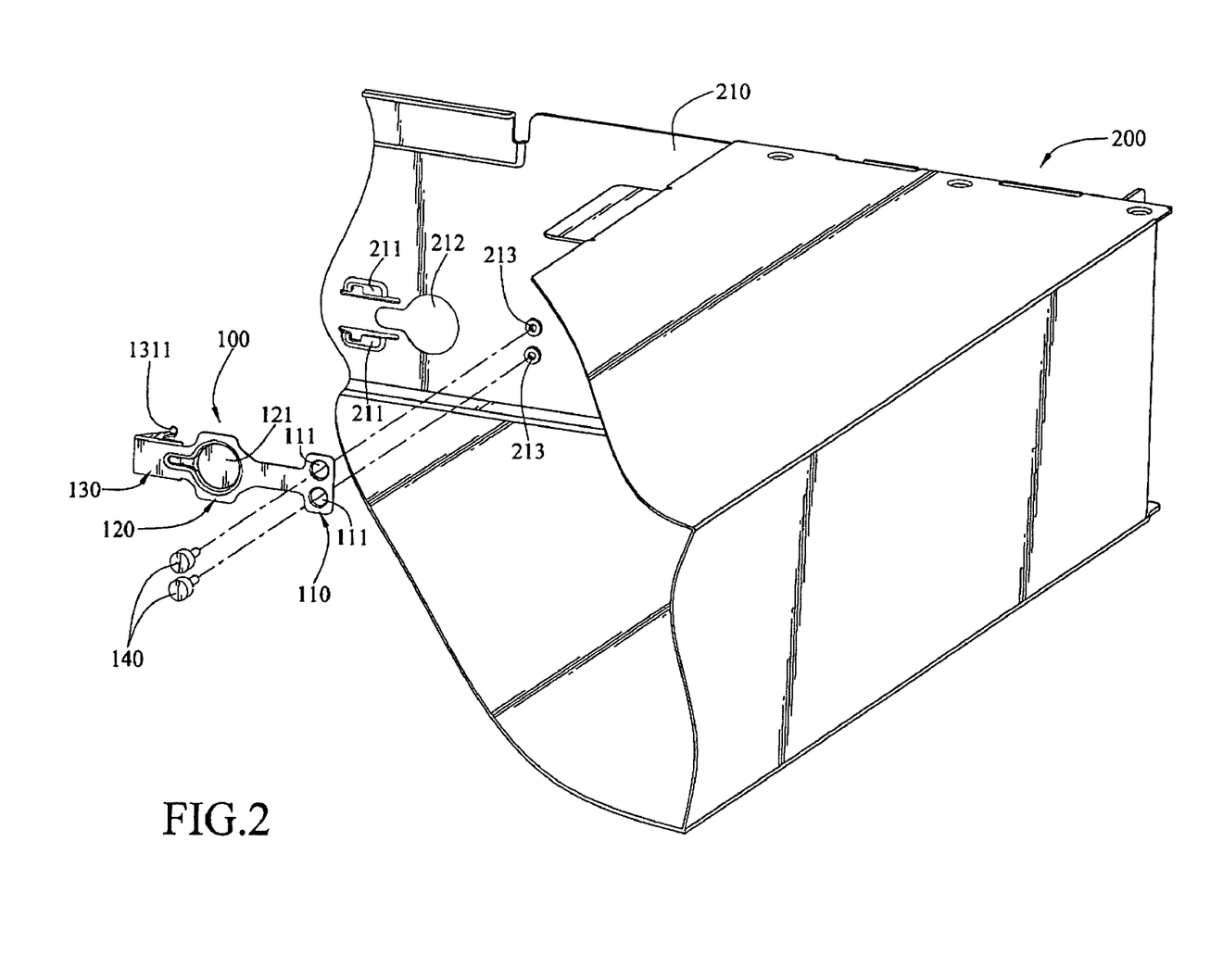
FIG. 2 is an exploded view of the stop member and a case of a computer device according to the present invention.
Figure 3:
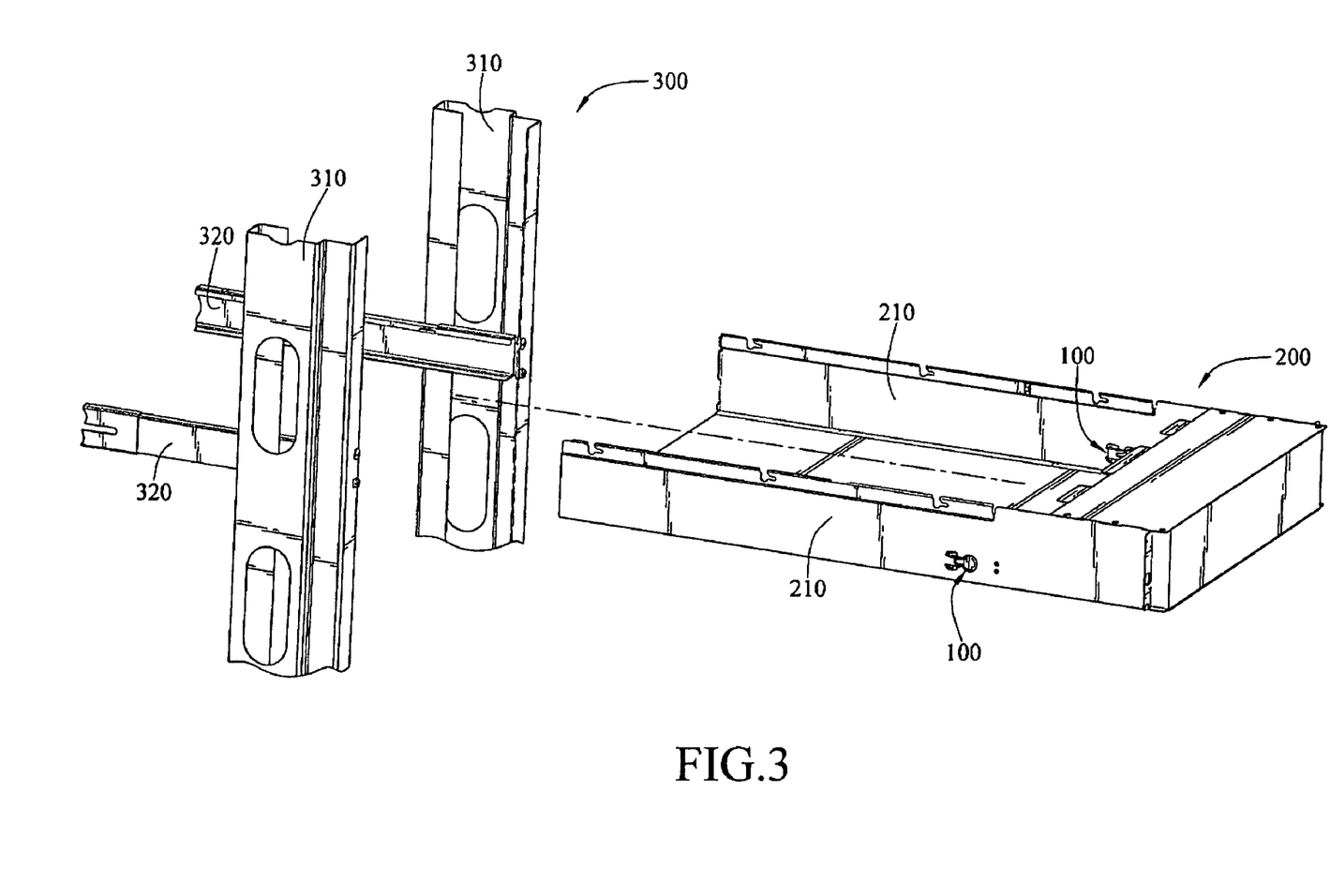
FIG. 3 is an exploded view of the case and a cabinet according to the present invention.
Figure 4A:
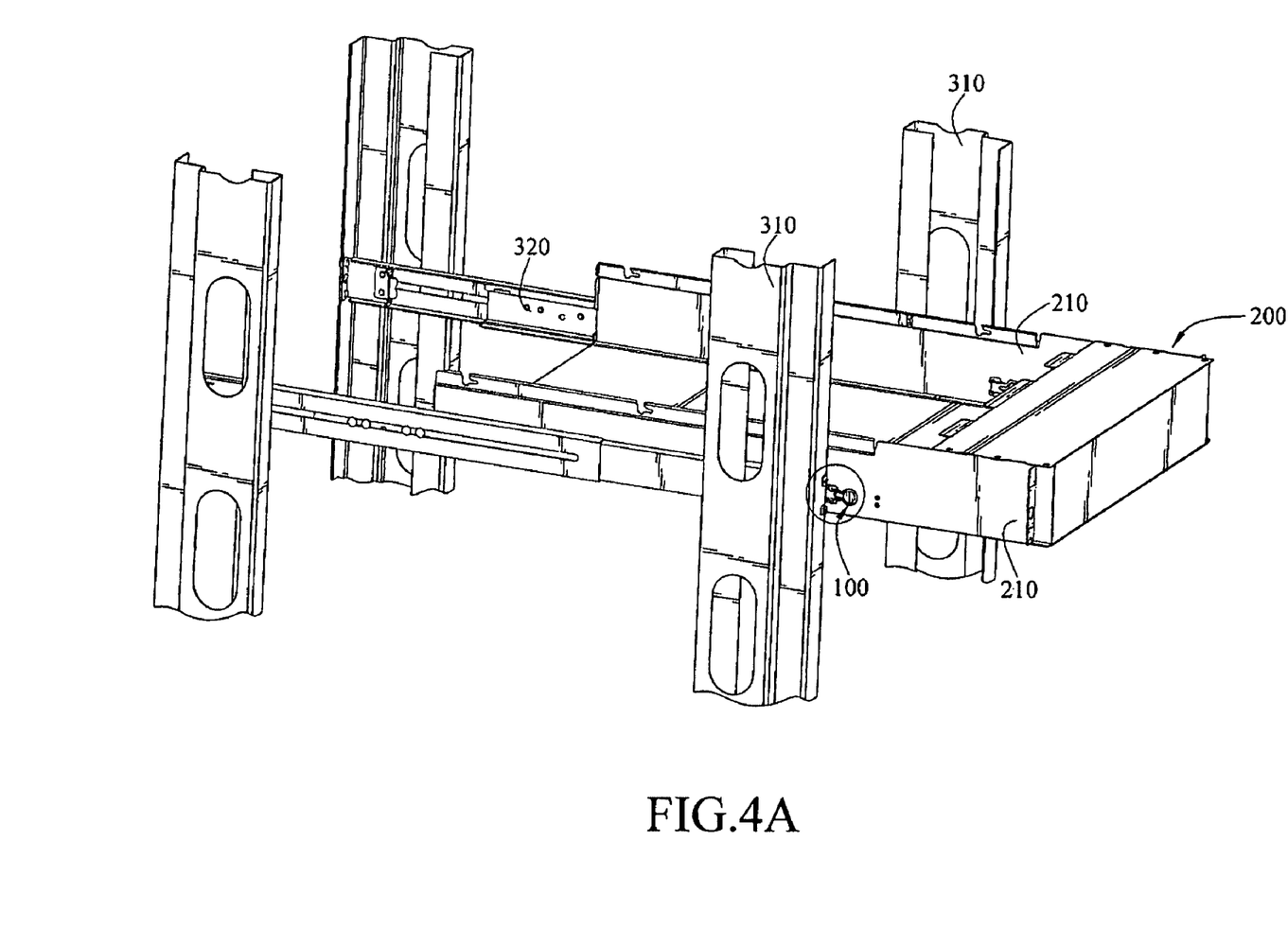
FIG. 4A is a schematic view of the case disposed in the front of the cabinet according to the present invention.
Figure 4B:
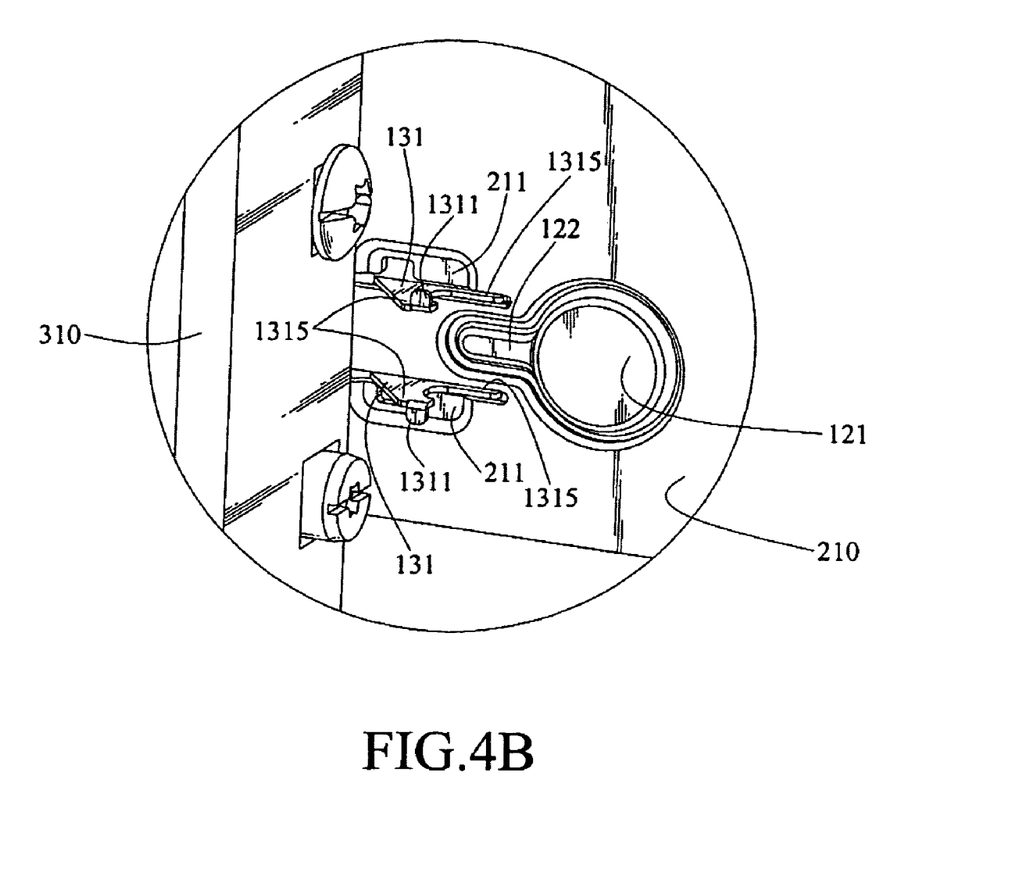
FIG. 4B is a schematic partial enlarged view of FIG. 4A.
Figure 4C:
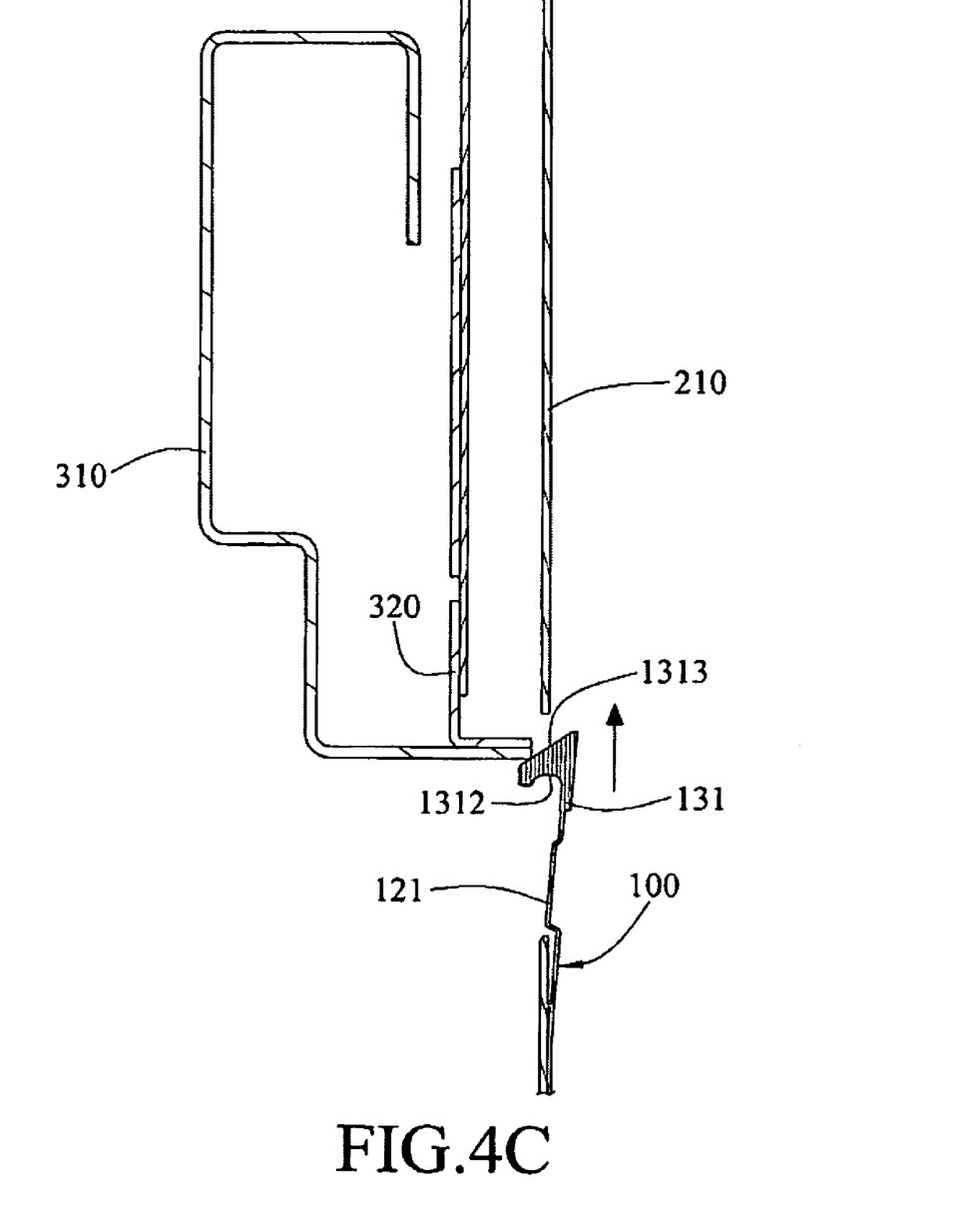
FIG. 4C is a schematic partial plane view of FIG. 4A.
Figure 5:
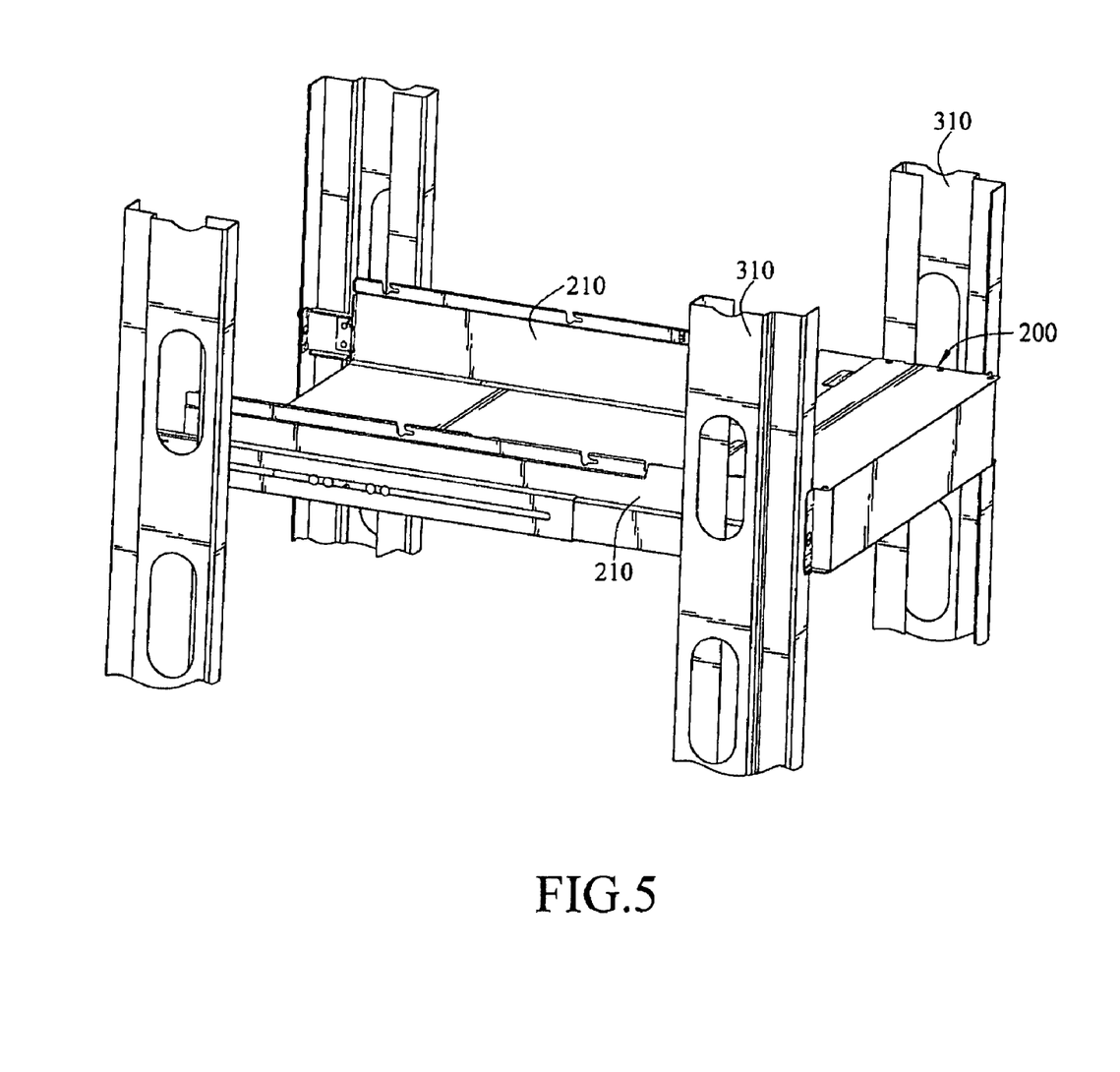
FIG. 5 is a schematic view of the case disposed in the cabinet according to the present invention.
Figure 6A:
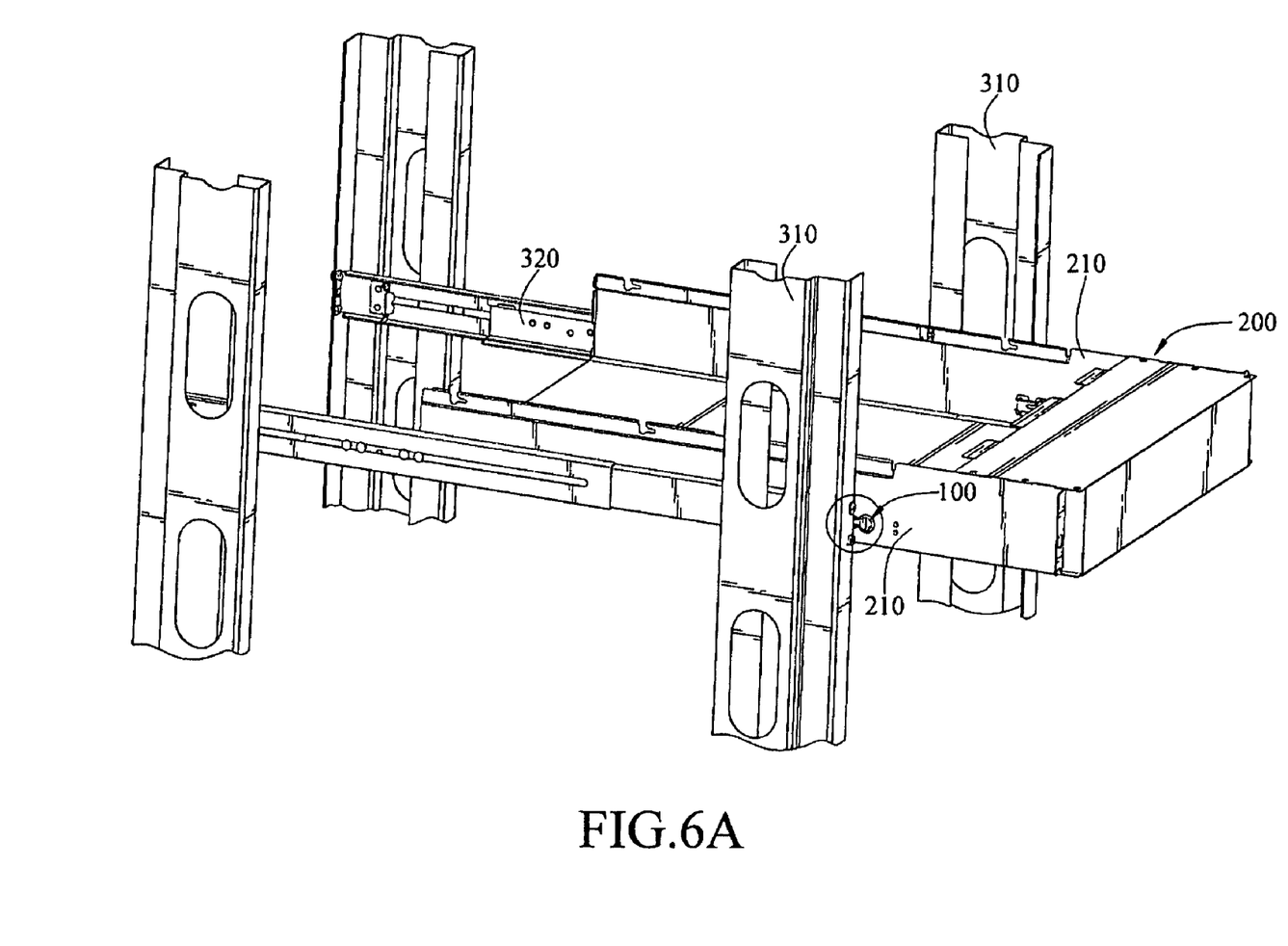
FIG. 6A is a schematic view of the case limited in the cabinet according to the present invention.
Figure 6B:
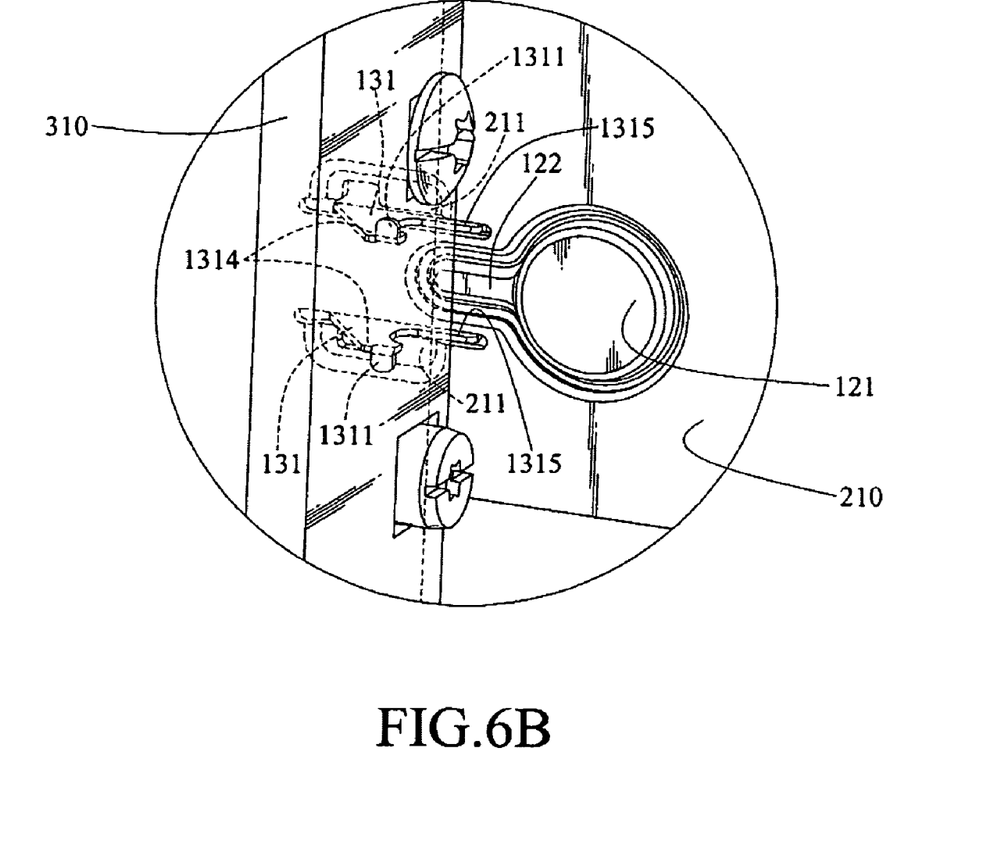
FIG. 6B is a schematic partial enlarged view of FIG. 6A.
Figure 6C:
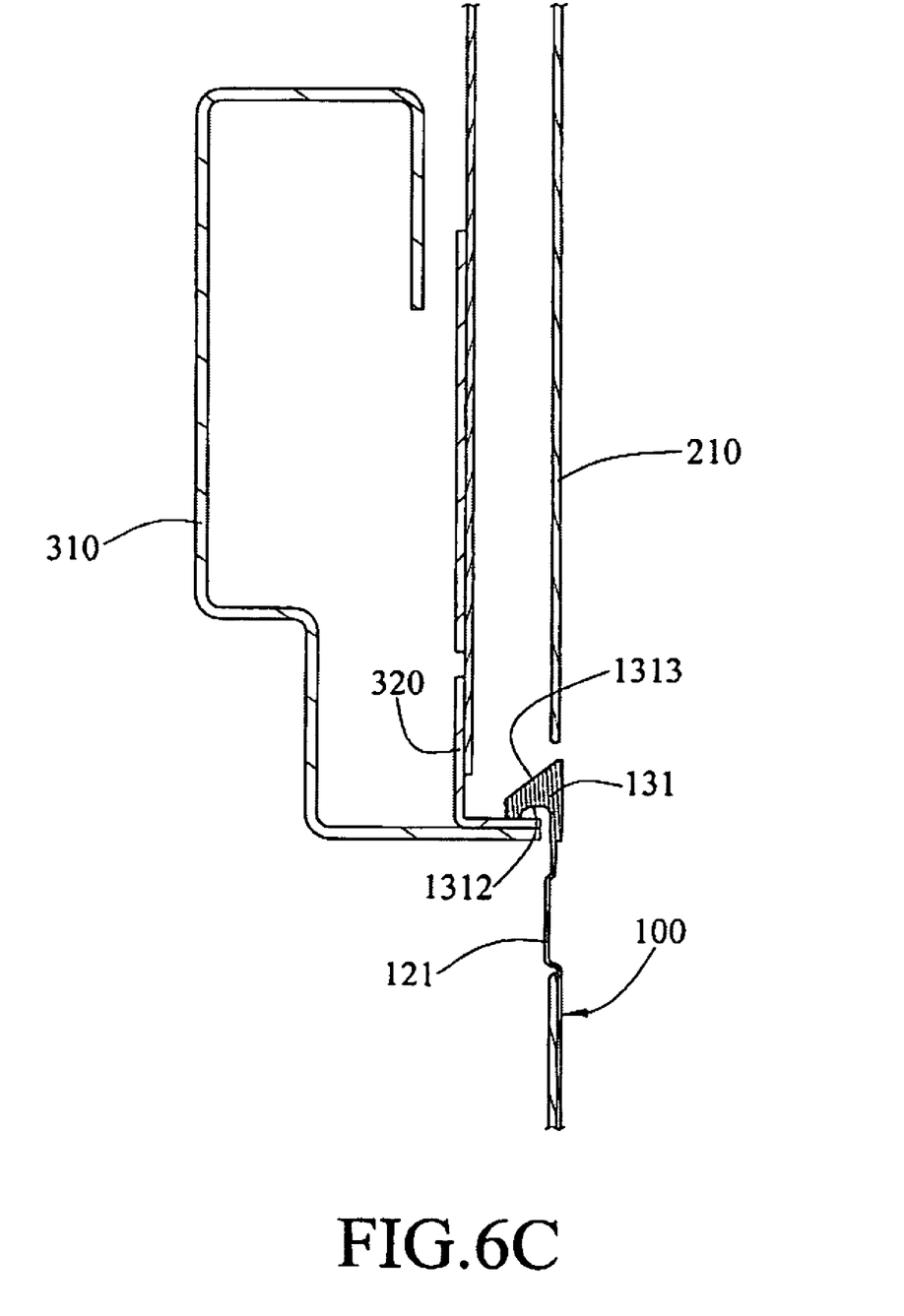
FIG. 6C is a schematic partial plane view of FIG. 6A.

FIGS. 1 to 3 are respectively a schematic view and exploded views of a stop member in an embodiment of the present invention. As shown in the figures, the stop member 100 of the present invention is of a sheet structure disposed on a case 200 of a computer device, and two opposite sidewalls 210 of the case 200 have a first slot 211, a second slot 212, and two fixing holes 213, respectively. The case of the computer device having the stop member 100 is loaded in a cabinet 300. The cabinet 300 disclosed in the present invention is formed by a plurality of frame pillars 310. The cabinet 300 is horizontally disposed with a slide rail 320 connected at an inner side surface of each frame pillar 310, so that the case 200 may slide in horizontally to be disposed in the cabinet 300. In addition, the computer device disclosed in the present invention comprises, but not limited to, computer devices such as a server computer, a notebook computer, and a flat panel computer. In the following detailed description of the present invention, the server computer is taken as a most preferred embodiment of the present invention. However, the accompanying drawings are only provided for reference and illustration purposes, instead of limiting the present invention.

Referring to FIGS. 1 and 2, the stop member 100 of the present invention comprises a fixing section 110, a cantilever section 120, and a stop section 130. The fixing section 110 has two penetrating joint holes 111. The fixing section 110 is fixed on an inner side surface of the sidewall 210 of the case 200 by penetrating a securing component 140, for example, a rivet, through the joint hole 111 and fixing the securing component 140 in the fixing hole 213. The manner of installing the stop member 100 to the case 200 is not limited herein, but also comprises spot welding and other fixing manners. In this embodiment, in a direction that the computer device is drawn out of the cabinet 300, positions of the stop member 100 disposed on the case 200 are sequentially the fixing section 110, the cantilever section 120, and the stop section 130. That is, when the computer device is drawn from the cabinet 300, portions of the stop member 100 exposed out of the cabinet 300 are sequentially the fixing section 110, the cantilever section 120, and the stop section 130. However, those skilled in the art may also employ other joining manners to fix the fixing section 110 on the case 200, and the joining manners are not limited herein. The cantilever section 120 is formed by extending from the fixing section 110, and is not fixed on the case 200. Hence, the cantilever section 120 may be elastically deformed and displaced relative to the fixing section 110 and the case 200. The stop section 130 has at least one blocking piece 131 for limiting the movement of the computer case in the cabinet. In this embodiment, the stop section 130 is formed by extending from another side of the cantilever section 120 opposite to the fixing section 110. Two opposite sides of a side surface of the stop section 130 are bended with two blocking pieces 131, so as to be protrusively disposed on a side surface of the stop section 130. The shape of the blocking piece 131 matches with that of the first slot 211 of the case 200, and the blocking piece 131 normally passes through the first slot 211 and is protrusively disposed on an outer side surface of the sidewall 210 of the case 200. It should be noted that the stop member 100 of the present invention is of an integrally formed sheet structure. Moreover, those skilled in the art may also adopt joining manners such as adhesion and welding to sequentially join the fixing section 110, the cantilever section 120, and the stop section 130 into the stop member 100 of the present invention, and the joining manners are not limited herein.

Further referring to FIGS. 1 and 2, the cantilever section 120 of the stop member 100 also has a press portion 121 depressed inwardly towards one direction and a reinforcing rib 122 connected to the press portion 121. The shapes of the press portion 121 and the reinforcing rib 122 match with that of the second slot 212 of the case 200. The press portion 121 and the reinforcing rib 122 normally pass through the second slot 212 and are protrusively disposed on the outer side surface of the sidewall 210 of the case 200. One end of each blocking piece 131 of the stop member 100 (that is, a top end of the blocking piece 131) is bended with a limiting portion 1311, and the limiting portion 1311 forms a perpendicular relation with the top end of the blocking piece 131 at almost a right angle. Additionally, one side of the blocking piece 131 is of an inwardly depressed structure 1312. Another side of the blocking piece 131 opposite to the inwardly depressed structure 1312 is a guiding oblique edge 1313. The top end of each blocking piece 131 further has a guiding surface 1314 extending from the guiding oblique edge 1313. The guiding surface 1314 is adjacent to the limiting portion 1311, and a top surface of the guiding surface 1314 is coplanar with a top surface of the limiting portion 1311, such that when the case 200 is installed in the cabinet 300, the blocking piece 131 slides successfully into the slide rail 320 through the guiding oblique edge 1313 and the guiding surface 1314.

In addition, each blocking piece 131 further has a sheet body 1315 extending along an outer edge of the stop section 130 towards the cantilever section 120, and the sheet body 1315 and the reinforcing rib 122 of the cantilever section 120 are disposed in an interlaced manner (the reinforcing rib 122 is located between the sheet bodies 1315 of the two blocking pieces 131), thereby increasing the strength of the structure of the stop member 100, so as to avoid plastic deformation of the stop member 100.

Referring to FIGS. 3 to 6C, as the blocking piece 131 protruding from the case 200 overlaps an installing path of the case 200, the blocking piece 131 forms a mutual interfering relation with the frame pillars 310 of the cabinet 300. When the case 200 having the stop member 100 is disposed in the cabinet 300 through the slide rail 320, the blocking piece 131 is held against the frame pillars 310 by the guiding oblique edge 1313. The case 200 applies a force to the blocking piece 131 under the guide of the guiding oblique edge 1313. Thereby, the blocking piece 131 together with the cantilever section 120 is stressed and deformed, and then merged inwardly into the first slot 211, such that the case 200 enters the cabinet 300 successfully. When the case 200 is installed in the cabinet 300, the force applied to the blocking piece 131 disappears. The cantilever section 120 restores its original normal position, and enables the blocking piece 131 to protrude from an outer side surface of the case 200 through the first slot 211.

Figure 7A:
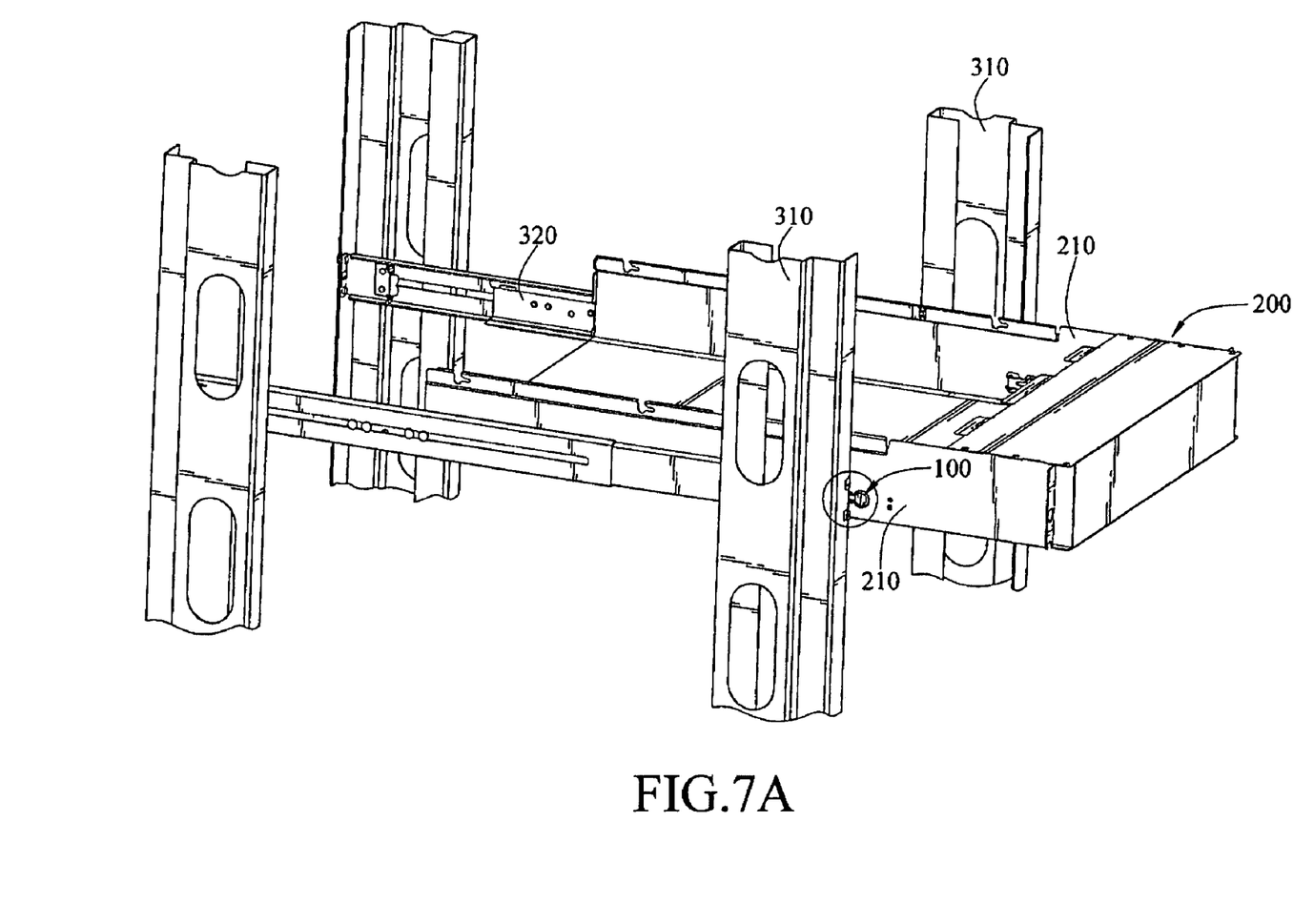
FIG. 7A is a schematic view of the case drawn out of the cabinet according to the present invention.
Figure 7B:
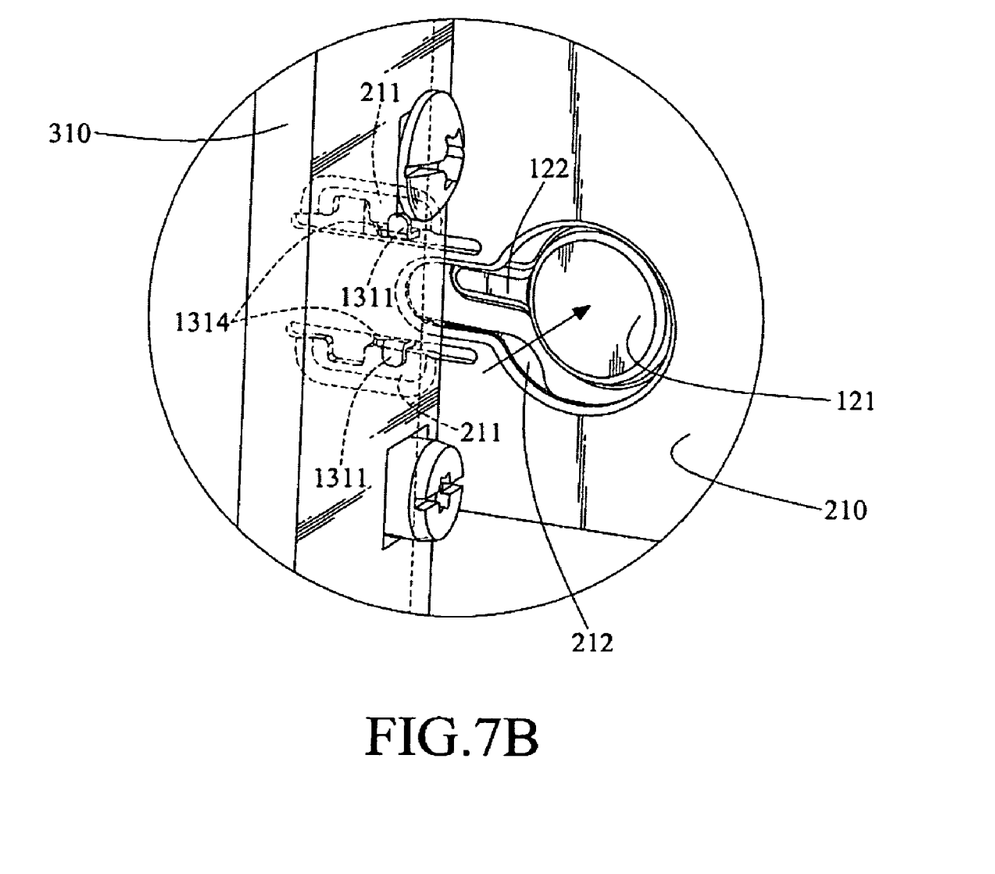
FIG. 7B is a schematic partial enlarged view of FIG. 7A.
Figure 7C:
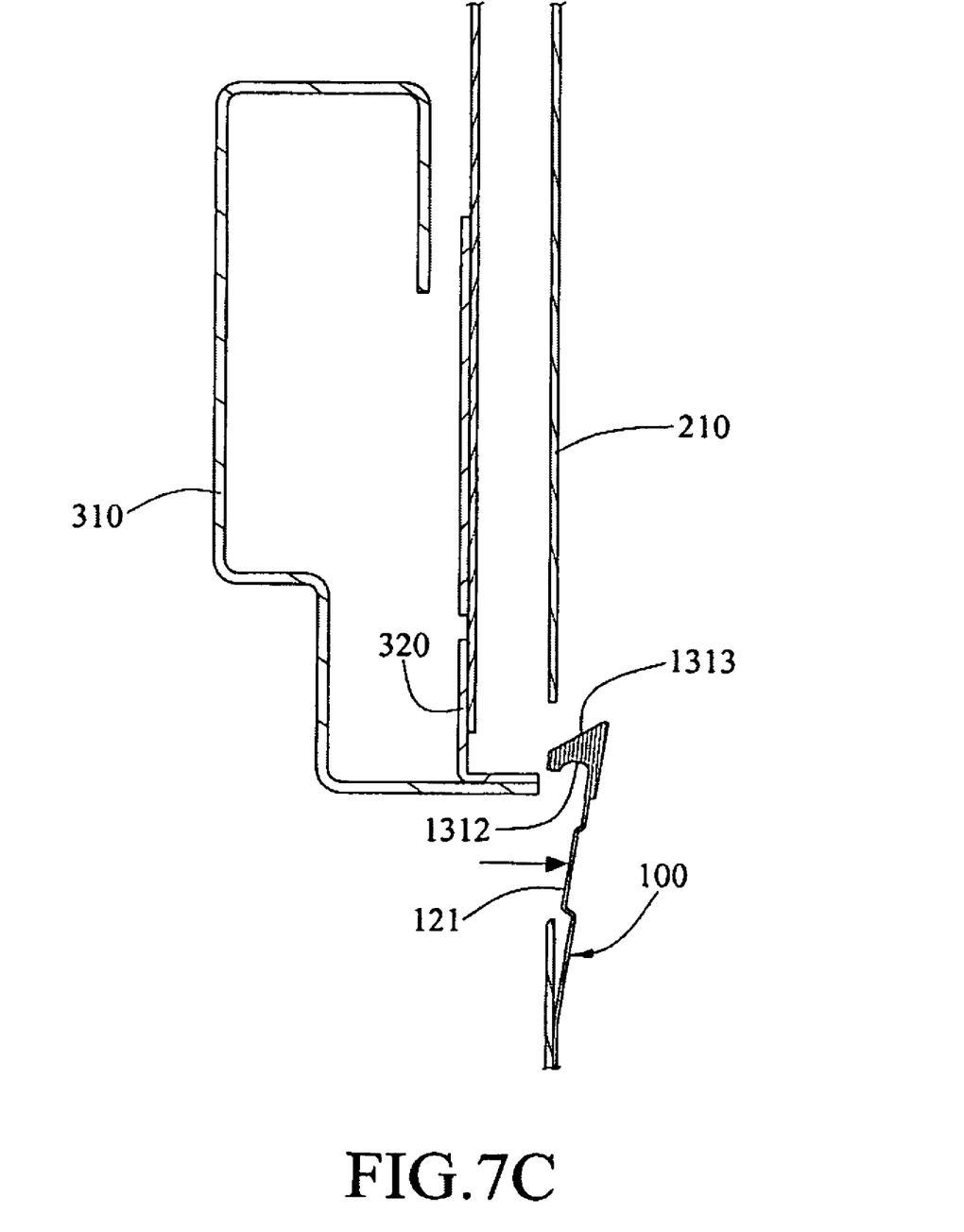
FIG. 7C is a schematic partial plane view of FIG. 7A.

Referring to FIGS. 7A to 7C, when the case 200 is drawn out of or detached from the cabinet 300, the blocking piece 131 protruding from the outer side surface of the case 200 is held against the slide rail 320 of the frame pillar 310 of the cabinet 300 on one side of the inwardly depressed structure 1312, so as to prevent the case 200 from continuing displacing outwards, thus avoiding that the case 200 overturns from the cabinet 300 due to its own weight or under an external force. At this point, operators may safely perform online maintenance operations on the computer device, without fearing the possibility that the computer device may continue to slide out of the cabinet 300. The side of the blocking piece 131 of the present invention for being held against the cabinet 300 is designed as an inwardly depressed structure 1312. When the blocking piece 131 and an end of the slide rail 320 are held against each other and stressed, the stressed surface is close to the top end of the blocking piece 131. Hence, the problem that the blocking piece 131 is displaced towards an inner side of the case 200 due to an inward force to the blocking piece 131 generated when the stressed surface is a whole straight line with no inwardly depressed shape, so as to ensure a limiting reliability. That is, the inwardly depressed structure 1312 may effectively compensate the force that the blocking piece 131 is stressed and deformed towards the inner side of the case 200, so that the possibility that the blocking piece 131 is deformed inwardly and merged into the first slot 211 during the process is eliminated. In addition, the position of the stop member 100 of the present invention disposed on the case 200 is a most preferred position obtained by calculation and practical application. Preferably, when the stop member 100 is held against the slide rail 320, a gravity center of the case 200 is still on the cabinet 300. Therefore, when the case 200 is drawn out of the cabinet 300 by a distance, the stop member 100 may indeed provide a limiting effect, and will not cause an overturn of the case 200.

If the computer device needs to be detached from the cabinet 300, the case 200 is first drawn out of the cabinet 300 by a distance, and the stop member 100 is also drawn out of the cabinet 300 together with the case 200. Then, the press portion 121 exposed out of the outer side surface of the case 200 is pressed, such that the cantilever section 120 is stressed and deformed. Meanwhile, the blocking piece 131 protruding from the outer side surface of the case 200 is driven to be merged into the first slot 211 (that is, the blocking piece 131 retracts into the case 200), so as to remove the limit relation between the stop member 100 and the case 200. The case 200 may hence slide out of the cabinet 300 successfully. When the blocking piece 131 is merged into the first slot 211, the limiting portion 1311 located at the end of the blocking piece 131 is held against the outer side surface of the sidewall 210 of the case 200, so as to limit the merging range of the blocking piece 131, thereby avoiding problems of plastic deformation or even fracture generated due to excess deformation of the cantilever section 120 and the stop section 130. A bump is depressed inwardly at a position of the sidewall 210 of the case 200 corresponding to the limiting portion 1311. The shape of the bump matches with the limiting portion 1311. When the limiting portion 1311 is held against the outer side surface of the sidewall 210 of the case 200, the limiting portion 1311 is just accommodated within the bump, so that the limiting portion 1311 is coplanar with or lower than the outer side surface of the sidewall 210 of the case 200, thereby facilitating the movement of the case 200 within the cabinet 300 (drawn out of the cabinet 300 or installed in the cabinet 300) without being interfered. In addition, the reinforcing rib 122 may increase the structural strength of the stop member 100, so as to reduce the stress when the press portion 121 is pressed by an excessively large force, and thus prolong the service life of the stop member 100.

Figure 8A:
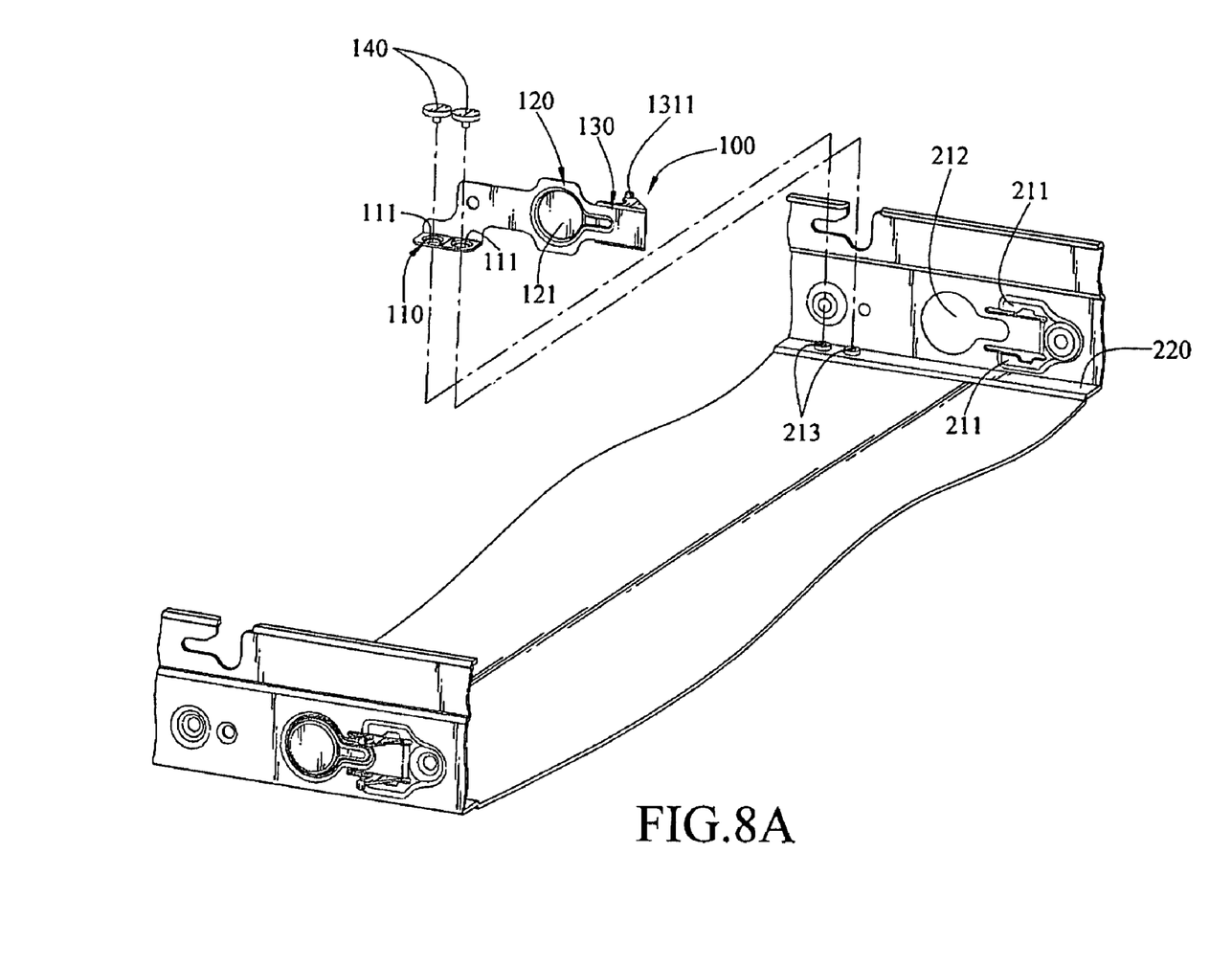
FIG. 8A is an exploded view of the stop member disposed in the case in a different joining manner according to the present invention.
Figure 8B:
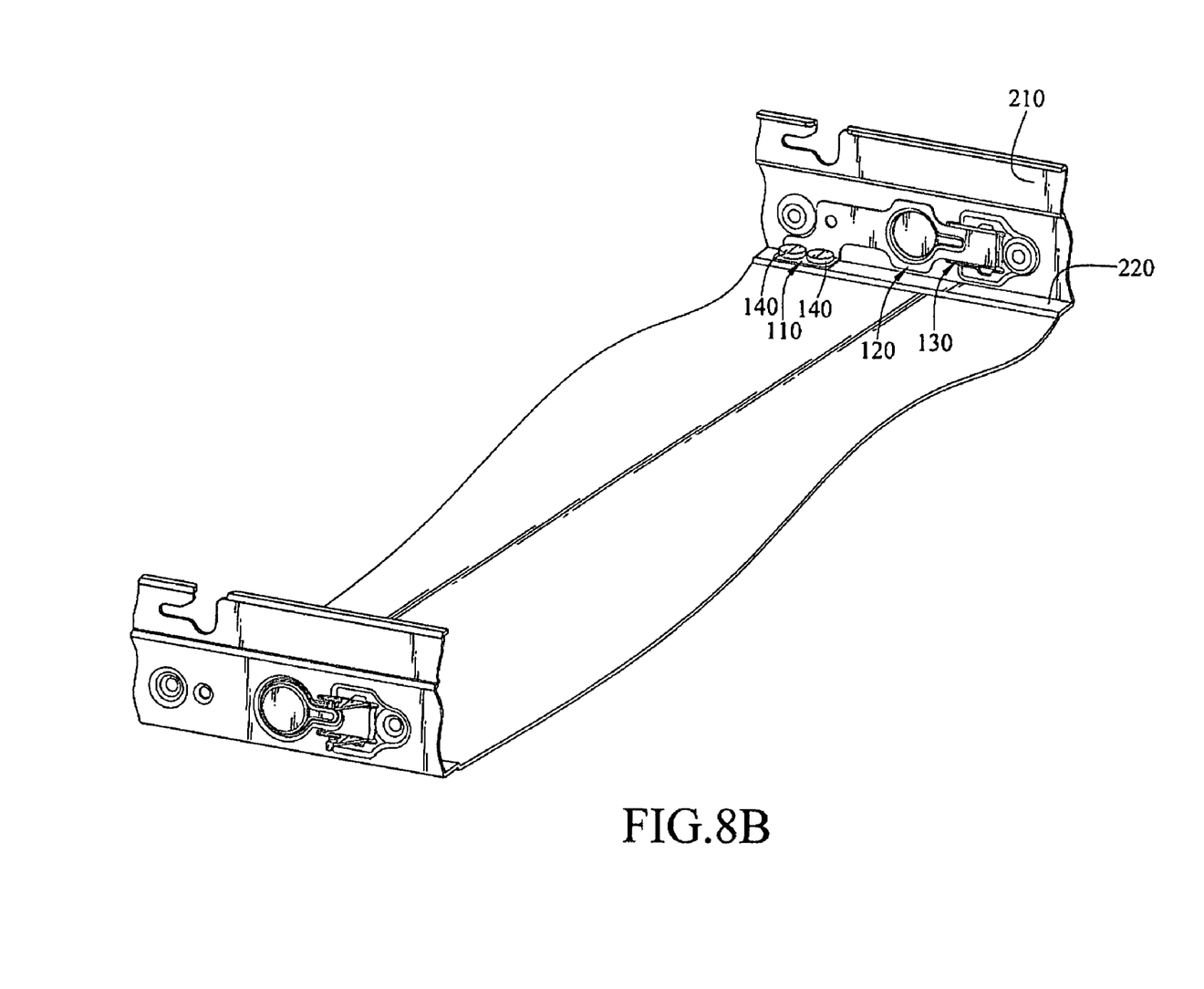
FIG. 8B is a schematic partial view of the stop member disposed in the case in a different joining manner according to the present invention.

FIGS. 8A and 8B are schematic views of a stop member disposed in a case in different joining manners. Members of this embodiment are partially the same as those in the foregoing embodiment, and like symbols are used to represent identical or similar components. The difference of this embodiment from the foregoing embodiment is as follows. The stop member 100 in FIG. 1 is directly fixed on the inner side surface of the sidewall 210 of the case 200, and thus has a relatively long force arm, so as to effectively solve the problem of plastic deformation generated after the stop member 100 is used for a long time. For the stop member disclosed in FIGS. 8A and 8B, due to a size limit of the case 200, the fixing section 110 is fixed on the bottom sidewall 220 of the case 200 by penetrating the securing component 140, for example, a rivet, through the penetrating joint hole 111 of the fixing section 110 and fixing the securing component 14 in the fixing hole 213 of the bottom sidewall 220. Therefore, this embodiment eliminates the limit that the installing space required by the stop member in FIG. 1 needs a certain length, and meanwhile the stop member also has an effect of preventing plastic deformation.

In view of the above, according to the present invention, through the relation that the stop member disposed in the case of the computer device is held against the cabinet, the computer device can be stably drawn out of the cabinet by a distance and will not overturn. Thereby, the operator does not need to completely draw the case of the computer device out of the cabinet in maintenance. Hence, the maintenance time is greatly reduced and the maintenance process is also simplified. Meanwhile, the possibility that the case falls off from the cabinet due to its own weight or under an external force is eliminated, and the computer device loaded in the cabinet is thus effectively protected.

What is claimed is:

1. A case structure for a computer device disposed in a cabinet, the case structure comprising:
   a case, having a first slot on at least one sidewall of the case; and
   a stop member, disposed on the sidewall of the case, the stop member comprising:
      a fixing section, fixed inside the case;
      a cantilever section, formed by extending from the fixing section, and capable of being deformed and displaced relative to the fixing section; and
      a stop section, formed by extending from the cantilever section, wherein at least one blocking piece is disposed protrusively on a side surface of the stop section, and the blocking piece normally passes through the first slot and is disposed protrusively on an outer side surface of the sidewall of the case, such that the blocking piece is held against the cabinet, and when the cantilever section is deformed and displaced, the blocking piece is merged into the first slot,
   wherein when the computer device is drawn out of the cabinet, portions of the stop member exposed out of the cabinet are sequentially the fixing section, the cantilever section, and the stop section.

2. The case structure according to claim 1, wherein the fixing section has at least one joint hole, the sidewall of the case has at least one fixing hole, at least one securing component passes through the joint hole and is secured to the fixing hole, and thereby the fixing section is fixed on the sidewall.

3. The case structure according to claim 1, wherein the case has a bottom sidewall, the bottom sidewall has at least one fixing hole, the fixing section has at least one joint hole, at least one securing component passes through the joint hole and is secured to the fixing hole, and thereby the fixing section is fixed to the bottom sidewall.

4. The case structure according to claim 1, wherein the cantilever section has a press portion, the at least one sidewall of the case has a second slot, and the press portion normally passes through the second slot and is disposed protrusively to the outer side surface of the sidewall of the case.

5. The case structure according to claim 4, wherein the cantilever section further has a reinforcing rib connected to the press portion, the blocking piece further has a sheet body extending along an outer edge of the stop section towards the cantilever section, and the sheet body and the reinforcing rib of the cantilever section are disposed in an interlaced manner.

6. The case structure according to claim 1, wherein the blocking piece further has a limiting portion formed by bending one end of the blocking piece, a bump is depressed inwardly at a position of the sidewall corresponding to the limiting portion, when the blocking piece is merged into the first slot, the limiting portion is held against the outer side surface of the sidewall of the case and is accommodated in the bump, and an outer surface of the limiting portion is coplanar with or lower than the outer side surface of the sidewall.

7. The case structure according to claim 6, wherein one end of the blocking piece further has a guiding surface, the guiding surface is adjacent to the limiting portion, and a top surface of the guiding surface is coplanar with a top surface of the limiting portion.

8. The case structure according to claim 1, wherein one side of the blocking piece is an inwardly depressed structure.

9. The case structure according to claim 1, wherein another side of the blocking piece is a guiding oblique edge.

10. The case structure according to claim 1, wherein the stop section has two blocking pieces formed by respectively bending two opposite sides of the stop section.

* * * * *